(12) United States Patent
Lee et al.

(10) Patent No.: US 6,319,439 B1
(45) Date of Patent: Nov. 20, 2001

(54) METHOD OF SYNTHESIZING EVEN DIAMOND FILM WITHOUT CRACKS

(75) Inventors: Jae-Kap Lee; Young Joon Baik; Kwang Yong Eun, all of Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 09/513,319

(22) Filed: Feb. 25, 2000

(30) Foreign Application Priority Data

Apr. 30, 1999 (KR) .................................................. 99/15647

(51) Int. Cl.$^7$ .................................................. C30B 25/00
(52) U.S. Cl. .............................. 264/81; 117/89; 117/105; 117/929; 264/430; 264/483; 427/249.8; 427/249.13
(58) Field of Search .............................. 264/81, 345, 483, 264/430; 117/89, 104, 105, 929; 427/249.8, 249.13, 249.14

(56) References Cited

U.S. PATENT DOCUMENTS

| 5,270,077 | 12/1993 | Knemeyer et al. . |
| 5,286,524 | * 2/1994 | Slutz et al. . |
| 5,411,758 | * 5/1995 | Simpson ................................ 427/249 |
| 5,507,987 | 4/1996 | Windischmann . |
| 5,587,013 | 12/1996 | Ikegaya et al. . |
| 5,587,124 | 12/1996 | Meroth . |
| 5,776,246 | * 7/1998 | Tanabe et al. .......................... 117/89 |

* cited by examiner

Primary Examiner—Mathieu D. Vargot
(74) Attorney, Agent, or Firm—Scully, Scott, Murphy & Presser

(57) ABSTRACT

A method of synthesizing an even free-standing diamond film without growth cracks is disclosed. The intrinsic tensile stress of a diamond film is compensated by an artificial compressive stress with a step down control of the deposition temperature during deposition. After a diamond film is deposited with a predetermined thickness at a deposition temperature, the deposition temperature is decreased in multiple steps during the deposition. The bending of the diamond wafer is minimized by using a tungsten substrate with higher elastic modulus than molybdenum.

12 Claims, 3 Drawing Sheets

$t_0$ $t_1$ $t_2$

METHOD OF SYNTHESIZING EVEN DIAMOND FILM WITHOUT CRACKS

BACKGROUND OF THE INVENTION

1. Field of the Invention

The present invention relates to a method of synthesizing a diamond film by using a chemical vapor deposition.

2. Description of the Background Art

Chemical vapor deposited (CVD) diamond films usually exhibit considerably high stress level. This has been considered due to their deposition conditions of using non-diamond substrates at high temperatures of 700° C.–1,000° C. and/or incorporating defects with microstructural changes during deposition. Under a high stress level, diamond films may crack or fracture during or after deposition. Also, in the case of synthesizing thick films on a large area of several-inch scale, stress may bend the diamond films.

Internal stress in films can be classified into two categories, thermal and intrinsic stresses. Thermal stress develops due to the difference in the thermal expansion coefficients between the diamond film and the substrate material. It appears only in the case that the diamond films are attached on the substrate, and can be calculated by the following equation (1), $$\sigma_{th} = \frac{E_D}{1-v}(\alpha_f - \alpha_s)(T_d - T_m) \qquad (1)$$

where, $$\frac{E_D}{1-v}$$

indicates a biaxial Young's modulus of the diamond, $\alpha_f$, and $\alpha_s$ are thermal expansion coefficient(TEC) of the diamond film and substrate, respectively, and $T_d$ and $T_m$ are the deposition and room temperature, respectively. At temperatures lower than the deposition temperature, thermal stress is "compressive(−)" if the TEC of the substrate is larger than that of the diamond. At room temperature, the magnitude of the thermal stress in the diamond films on refractory metals is reported to be several GPa.

On the other hand, in free standing film deposition, that is, films separated from the substrate, thermal stress is released at the instant when a film is separated from the substrate during the cooling down from the deposition temperature to room temperature after deposition. In this stage, the diamond film can crack or fracture, if temperature on the whole substrate is not uniform or adhesive force between the diamond film and the substrate is too large. This type of crack or fracture is called "thermal crack" or "thermal fracture". These thermal crack or thermal fracture can be suppressed by keeping the substrate temperature uniform or controlling the adhesive force between the diamond film and the substrate.

On the other hand, intrinsic stress develops during the growth and it is expected to be induced by the variation of microstructure and incorporation of defects in the diamond films. However its detail mechanism is still under debate. Intrinsic stress is generally accepted as "tensile stress(+)" ranging from several hundreds MPa to several GPa, although several researchers obtained "compressive stress". As well known in the field of hard coating like diamond deposition, such tensile stress was reported to cause cracks.

In the deposition of free-standing diamond films thicker than several hundreds μm on a large area of several-inch scale, such tensile stress may cause serious problems. With increasing film thickness, tensile stress increases, while the strength of the diamond films decreases. This may crack the diamond films during deposition. This type of crack is called "growth crack". Also, a distribution of the tensile stress may bend the diamond films. The bending and the growth cracks of the diamond films make it impossible for the diamond film to be used as a material for an IR window, a microwave window, or a multi-chip module substrate, and increases its cost in application to any tools.

Accordingly, in order to resolve such problems, various researches have been done, and resultantly, various solutions have been proposed.

U.S. Pat. No. 5,270,077 discloses a use of an upwardly-convex substrate in order to compensate the bending phenomenon after observing that the diamond film bends concavely to its growth direction.

While, U.S. Pat. No. 5,587,124 discloses a use of an upwardly-concave substrate to synthesize an even diamond film after observing that the diamond film is bent in the opposite direction as opposed to U.S. Pat. No. 5,270,077.

These methods are effective; nevertheless, since the curvature is not easy to accurately estimate in machining the substrate, and in the case of using a curved substrate, a plasma intensity is to be varied depending on the position of the substrate, causing deterioration in uniformity of the diamond film.

U.S. Pat. No. 5,507,987 proposed a technique for reducing the bending of the diamond film by using a two-step synthesizing method, in which a diamond film having a predetermined thickness (approximately 150 μm) is synthesized in a first step at a low growth rate at which the diamond film does not bend much, and then is synthesized in a second step at a high growth rate at which the diamond film bends substantially, thereby minimizing the bend of the diamond film. However, this method deteriorates the efficiency in synthesizing the film, and the bending of the diamond film is not completely overcome.

U.S. Pat. No. 5,587,013 also uses a two-step synthesizing method similar to that of U.S. Pat. No. 5,507,987, in which a condition for forming a concave film (deposition temperature: 880~950° C., methane concentration: 2.5%CH$_4$~3.5%CH$_4$) and a condition for forming a convex film (deposition temperature: 800~850° C., methane concentration: 0.5%CH$_4$~1.5%CH$_4$) are respectively observed and then the two conditions are combined to deposit an even diamond film. However, this method is also disadvantageous in that the efficiency for synthesizing the diamond film is degraded because the methane composition and deposition temperature are varied.

SUMMARY OF THE INVENTION

Therefore, an object of the present invention is to provide a method for synthesizing even diamond films without growth cracks, and without no reducing the efficiency for synthesizing the diamond film.

To achieve these and other advantages of the present invention, as embodied and described herein, there is provided a method for synthesizing diamond films. Intrinsic tensile stress of the diamond films were compensated by the artificial compressive stress during deposition. This method perfectly suppressed the growth cracks of the diamond films. The bending of the diamond wafers was minimized by selecting an optimum material as the substrate while inducing the artificial compressive stress during deposition.

Compressive stress was induced by a step-down control of the deposition temperatures during deposition. Deposition temperature was decreased step-wise, after depositing the diamond films with a predetermined thickness at a deposition temperature. The magnitude of inducing the compressive stress may be controlled by the magnitude and numbers of decreasing the deposition temperature.

Further using tungsten with a high Young's modulus, as a substrate material, minimized the bending of the diamond films.

BRIEF DESCRIPTION OF THE DRAWINGS

The accompanying drawings, which are included to provide a better understanding of the present invention and are incorporated in and constitute as part of present specification, illustrate embodiments of the present invention and together with the description serve to explain the principles of the present invention.

In the drawings:

FIGS. 1A and 1B are schematic views of a process for controlling stress, of which:

FIG. 1A shows a state in which a diamond film with approximately 100 μm in thickness is deposited on a substrate at a deposition temperature of $T_0$, and is supposed to be tensile and;

FIG. 1B shows a principle which compressive stress is induced in a diamond film by decreasing the deposition temperature from $T_0$ to $T_1$;

FIGS. 2A to 2C are schematic views of a process where a substrate and a film are bent when a tensile stress occurs on the diamond thick film during deposition; of which:

FIG. 2A shows a substrate at an initial stage where no diamond film is synthesized(A substrate is flat);

FIG. 2B shows a state in which a diamond film under tensile stress is deposited until time $t_1$ (Both a substrate and a film are bent); and FIG. 2C shows a free-standing diamond film separated from the substrate after it was grown until time $t_2$ (A film is bent concavely to its growth direction); and, FIG. 3 is a graph showing a variation in bending of the free-standing diamond thick film according to the kinds of substrate material.

DETAILED DESCRIPTION OF THE PREFERRED EMBODIMENTS

Reference will now be made in detail to the preferred embodiments of the present invention, examples of which are illustrated in the accompanying drawings.

The present invention is directed to a method of synthesizing an even diamond free standing film without cracks by controlling the intrinsic stress applied to a film during deposition and selecting an optimum substrate.

There are two types of stresses, compressive and tensile. When the two stresses works at the same time on a static body, they are compensated by each other because their working directions are opposite from each other (compressive is "−" and tensile is "+"). The present invention adopts such a principle to control the tensile(or compressive) stress in the diamond films.

Figure 1A:
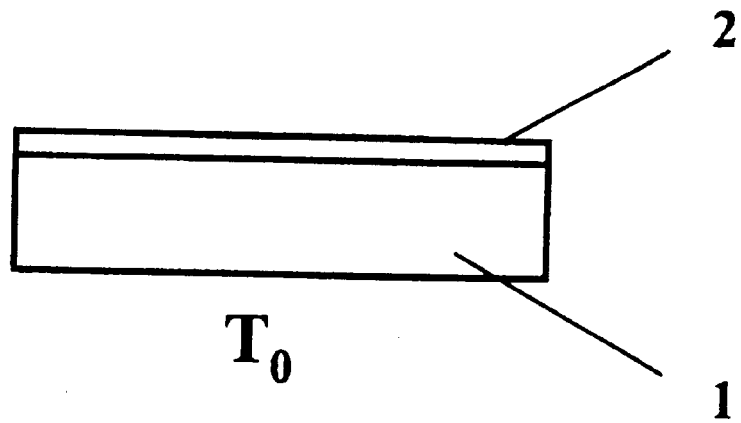
Figure 1B:
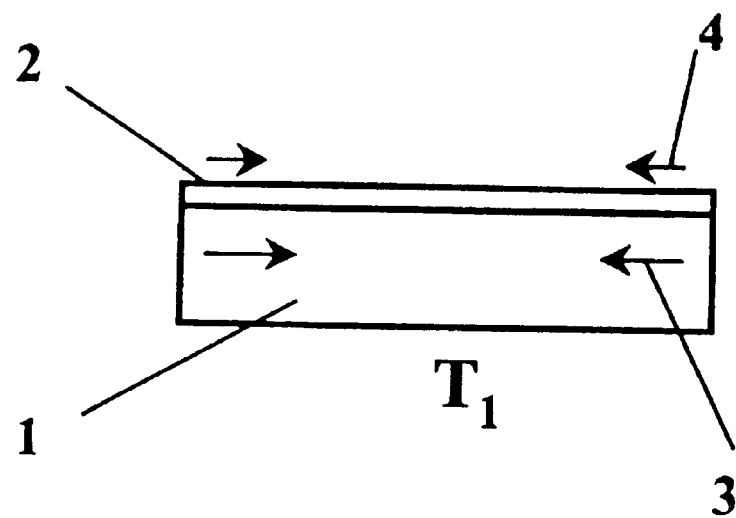

The process of the present invention is shown in FIG. 1 in detail. Referring to FIG. 1A, a diamond film 2 having a predetermined thickness is deposited on a substrate 1 (such as molybdenum) at $T_0$ of deposition temperature. Here, it is assumed that the diamond film is under tensile stress. Here, if the deposition temperature decreases to $T_1$ ($T_0 > T_1$), compressive (thermal) stress is induced in the diamond film, since the thermal expansion coefficient of the substrate(Mo) is greater than that of the diamond as shown below in Table 1, in which a degree of contraction 3 of the substrate is greater than a degree of contraction 4 of the diamond film.

TABLE 1

Physical properties of diamond and substrate materials

| | Coefficient of thermal Expansion $\alpha(°C.^{-1})$ | Young's modulus E (GPa) |
|---|---|---|
| Diamond | $3.1 \times 10^{-6}$ | 1050 |
| Mo | $5.6 \times 10^{-6}$ | 280 |
| W | $5.2 \times 10^{-6}$ | 420 |

Accordingly, compressive stress may compensate the tensile stress which had already occurred in the diamond film. In this respect, as shown in equation (1), the magnitude of the thermal compressive stress ($\sigma_{th}$) induced can be adjusted with varying the deposition temperature, as it is proportional to the difference of the deposition temperature.

With reference to Table 1, using molybdenum as a substrate, the change of the stress according to the decrease in deposition temperature is approximately −3.4 MPa/° C. based on equation (1). A deposition temperature drop of 10 ° C. may induce thermal compressive stress of −34 MPa, if molybdenum was used as a substrate material.

Meanwhile, a large drop in the deposition temperature above 50° C. has a bad influence on the synthesizing of the diamond film. Accordingly, the deposition temperatures have to be decreased in a multi-stage, i.e., little by little, if the stress to be applied is large.

According to the present invention, as described in the following examples, when diamond films grow under tensile stress on the inch-scale substrate, the growth cracks can be completely suppressed by inducing the compressive stress by a step down control of the deposition temperatures. Also, in the case that the compressive stress occurs on the diamond film, tensile stress by a step up control of the deposition temperatures may compensate the compressive stress.

Meanwhile, the bending phenomenon of the diamond film is known to resulted from a stress distribution developed through the film thickness. In this case, diamond films bend at the instant when it is separated from the substrate after deposition, in which bending of the diamond wafers is increased in proportion to the magnitude of a stress gradient through the film thickness. Such bend also can be suppressed by the present invention's step down(or up) control of the deposition temperatures.

Figure 2A:
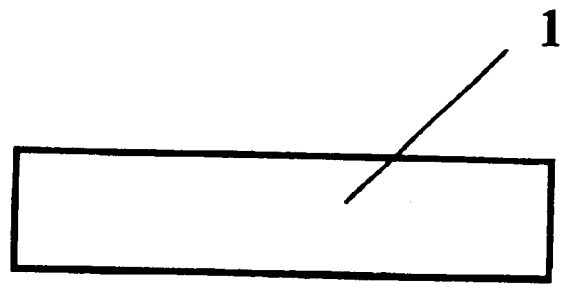
Figure 2B:
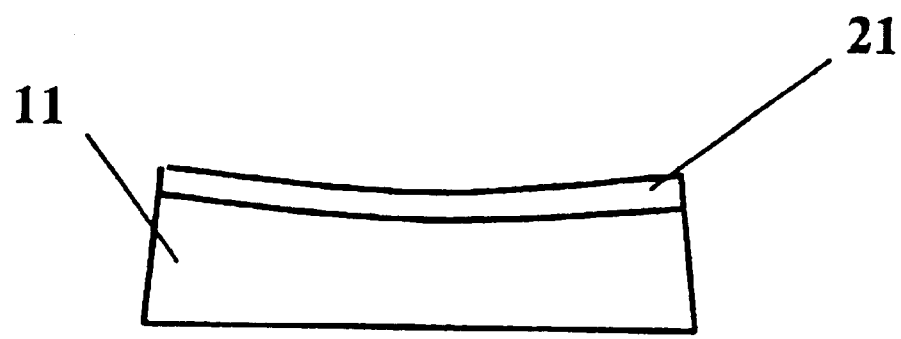
Figure 2C:
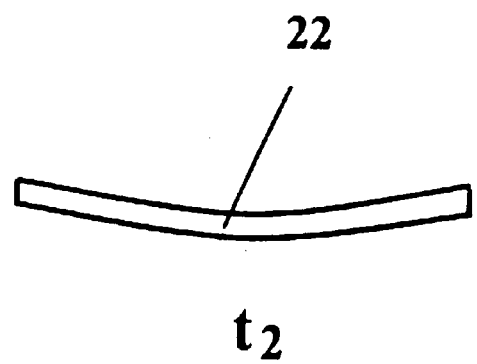

On the other hand, the bending phenomenon may also occur when the tensile stress or compressive stress is applied to the diamond film, even without the stress distribution through the film thickness. FIGS. 2A to 2C are schematic views showing of a process where the diamond film can be bent by its tensile stress during deposition.

The tensile stress is developed on the diamond film which is synthesized on an even substrate 1 during deposition time $t_1$. The tensile stress forces the substrate 11 to bend concavely to its growth direction, as shown in FIG. 2B. In his case, the diamond film 21 also bends concavely to its growth direction along the substrate. After further deposition time $t_2$, the free-standing diamond film 22 separated from the substrate is bent concavely to its growth direction. The total bending, as shown in FIG. 2C, is the sum of the bending of the substrate and the bending due to the (tensile) stress distribution through the film thickness.

Thus, the magnitude of the bending of the diamond film is influenced not only by the gradient of the tensile stress through the film thickness, but also physical properties of the substrate material(molybdenum is generally used as substrate material in thick free-standing diamond film deposition). As long as the bending of the substrate occurs within the elastic range, the greater the elastic modulus of the substrate material, the less the degree of the bending of the film synthesized on the substrate. To minimize the bending of the diamond film, the present invention uses tungsten as a substrate material.

Figure 3:
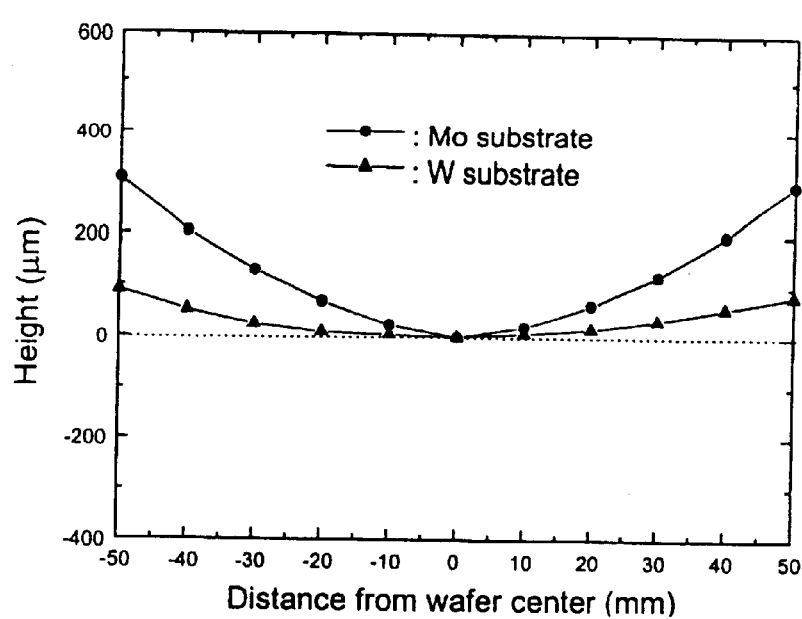

FIG. 3 is a graph showing a variation in the bending of the diamond free-standing films with the substrate materials under the same deposition conditions as above. The profile as shown in the figure was measured from the back surface of the film (a side of diamond film contacted with the substrate). The diamond film was bent concavely to its growth direction, and the bending of tungsten used as the substrate was much smaller than that for molybdenum. From noticing that the surface of the substrate is even after deposition, the deformation of the substrate during deposition is within the elastic range. Thus the Young's modulus of tungsten higher than that of molybdenum, as shown in Table 1, and enables the diamond film to bend less.

The present invention will now be described in detail through the following examples based on actual experiments.

EXAMPLE 1

Diamond film was synthesized on a molybdenum substrate having a diameter of four inches by a 7-cathode DC PACVD (Direct Current Plasma Assisted Chemical Vapor Deposition) apparatus. The input power, pressure, flow rate, methane concentration in hydrogen gas and deposition temperature were 17 kW, 100 Torr, 150 sccm, 6% and 1250° C., respectively. (The deposition temperature measured by a pyrometer is expected to be more than 200 ° C. higher than real temperature due to heat emission from the hot cathode, of which temperatures was measured around 2200 ° C.). The deposition time was 100 hours. The result of the synthesizing showed that growth cracks were formed on the back surface of the diamond film of which thickness was around 850 $\mu$m. And, the diamond film was bent concavely to its growth direction, of which bending was approximately 500 $\mu$m(the peak to valley height of the diamond film). This meant that the tensile stress developed in the diamond film.

EXAMPLE 2

Under the same condition as that of example 1, the deposition time was controlled to determine the critical thickness at which the growth crack generates. The diamond film was grown to 200 $\mu$m in thickness with no growth cracks observed. Meanwhile, when the film was grown to a thickness of 300 $\mu$m, growth cracks were observed. In this experiment, the bend of the diamond film could not be analyzed because the films were fractured by the thermal stress during the cooling of the substrate. In the case that the diamond film was synthesized by more than 600 $\mu$m in thickness, it was obtained without fracture. The film was observed to have growth cracks and to bend concavely to the growth direction, like in the example 1.

The growth cracks on the diamond film and the direction of the bending of the film were noticed almost similar under the synthesizing condition (that is, composition: 3%$CH_4$~8%$CH_4$, deposition temperature: 1200~1300° C.) given for the present example. As to the degree of the bending, the peak to valley was between 400 $\mu$m and 500 $\mu$m in a 4-inch diamond wafer having a thickness of 1 mm.

EXAMPLE 3

A diamond film was synthesized to a thickness of 200 $\mu$m under the same condition as of example 1, and was additionally synthesized by 100 $\mu$m after reducing the deposition temperature by 5~6° C. by lowering the input power (second step synthesizing as shown in FIGS. 1). No growth cracks were observed in the diamond film. However, the second-step synthesizing by more than 200 $\mu$m in thickness generated growth cracks on the back surface of the diamond film. This meant that the tensile stress formed during the second-step synthesizing cracks the film. Accordingly, in order to synthesize a thick film having a thickness of more than 500 $\mu$m, notably, the deposition temperatures had to be decreased in multiple steps. On the other hand, the large decrease of the deposition temperature by more than 50° C. at a time caused cracks.

EXAMPLE 4

Under the same synthesizing condition as of the example 1, the deposition temperature was decreased by 5~6° C. at 15-hour intervals by lowering the input power. In this case, no growth cracks were observed on the back surface of the diamond film. However, the film bent concavely to the growth direction, of which the peak to valley height at the 4-inch diameter wafer was approximately 300 $\mu$m. This result shows that the bending of the film can be relieved by the step down control of the deposition temperature.

EXAMPLE 5

A diamond film was synthesized for 100 hrs on a tungsten substrate having a diameter of 4-inch, under the same deposition condition as that of example 1. There were no growth cracks found on the synthesized diamond film. Like the case of using molybdenum as a substrate, the film bent concavely to the growth direction, but the peak to valley height on the 4-inch diameters wafer was approximately 80 $\mu$m, thus, the bending of the film was much improved. In this case, the distribution of the thickness of the diamond film was 810 $\mu$m~865 $\mu$m.

EXAMPLE 6

Two diamond films were synthesized for 100 hrs on respective tungsten and molybdenum substrates having a diameter of 3-inch(76 mm), under the same deposition condition as that of example 1. Two films bent concavely to the growth 2o direction, of which the peak to valley heights were similar each other, approximately 40 $\mu$m. Thus, the effect of the substrate materials(W or Mo) on the bending of the film was negligible in the case of small deposition area below 3-inch(76 mm) in diameter.

EXAMPLE 7

A diamond film was synthesized with 7% $CH_4$ under the same synthesizing condition as of the example 5. The deposition time was 100 hours. After synthesizing for 20 hours (at this time the film thickness was approximately 200 $\mu$m), the deposition temperature was decreased by the input power till 50 hours, and thereafter it was decreased by reducing the operating pressure by 5 torr at 15-hour intervals, which dropped the deposition temperature by 5~6°

C. There were no growth cracks observed on the back surface of the diamond film, and its peak to valley height was approximately 70 μm. In this case, the thickness of the diamond film was 1010 μm~1050 μm, where the growth rate was 10.1~10.5 μm/h.

As described herein, according to the method for synthesizing a diamond film of the present invention, the growth cracks were successfully eliminated, and the bending of diamond film was minimized, so that an even thick freestanding diamond wafers can be synthesized.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for synthesizing a diamond film, comprising the steps of depositing a diamond film in a predetermined thickness on a substrate at a deposition temperature, and at a fixed concentration of methane, by a chemical vapor deposition method; and depositing additional diamond film with the deposition temperature decreasing, while maintaining a fixed concentration of methane, to induce compressive stress to the diamond film during synthesizing.

2. The method according to claim 1, wherein the deposition temperature is decreased by reducing an operating pressure.

3. The method according to claim 1, wherein the deposition temperature is decreased by reducing an input power.

4. The method according to claim 1, wherein the deposition temperature is decreased less than 50° C. at one time.

5. The method according to claim 1, wherein a total range in which the deposition temperature is decreased is within 200° C.

6. A method for synthesizing a diamond film, comprising the steps of depositing a diamond film in a predetermined thickness on a substrate at a deposition temperature. and at a fixed concentration of methane, by a chemical vapor deposition method; and depositing additional diamond film with the deposition temperature increasing, while maintaining a fixed concentration of methane, to induce tensile stress to the diamond film during synthesizing.

7. The method according to claim 6, wherein the deposition temperature is increased by increasing an operating pressure.

8. The method according to claim 6, wherein the deposition temperature is increased by increasing an input power.

9. The method according to claim 6, wherein the deposition temperature is increased less than 50° C. at one time.

10. The method according to claim 6, wherein a total range in which the deposition temperature is increased is within 200° C.

11. The method according to claim 1, wherein if the diameter of the substrate is above 80 mm, the substrate material is tungsten.

12. The method according to claim 6, wherein if the diameter of the substrate is above 80 mm, the substrate material is tungsten.

* * * * *